United States Patent [19]
Chikaoka et al.

[11] Patent Number: 6,130,025
[45] Date of Patent: Oct. 10, 2000

[54] STEREOLITHOGRAPHIC RESIN COMPOSITION AND STEREOLITHOGRAPHIC METHOD

[75] Inventors: Satoyuki Chikaoka; Kazuo Ohkawa, both of Tokyo, Japan

[73] Assignee: Asahi Denka Kogyo Kabushiki Kaisha, Tokyo, Japan

[21] Appl. No.: 08/952,160

[22] PCT Filed: May 10, 1996

[86] PCT No.: PCT/JP96/01244

§ 371 Date: Nov. 12, 1997

§ 102(e) Date: Nov. 12, 1997

[87] PCT Pub. No.: WO96/35756

PCT Pub. Date: Nov. 14, 1996

[30] Foreign Application Priority Data

May 12, 1995 [JP] Japan ..................................... 7-137556

[51] Int. Cl.⁷ .............................. G03F 7/033; G03F 7/26; C08L 101/00; C08K 5/00
[52] U.S. Cl. ................... 430/280.1; 430/269; 430/270.1; 430/288.1; 430/286.1; 430/287.1; 522/25; 522/31; 522/129; 522/146; 264/401
[58] Field of Search .................................. 430/280.1, 269, 430/270.1, 288.1, 286.1, 287.1; 264/401; 522/25, 31, 129, 146

[56] References Cited

U.S. PATENT DOCUMENTS

| | | | |
|---|---|---|---|
| 4,593,051 | 6/1986 | Koleske | 522/31 |
| 5,468,786 | 11/1995 | Bayer et al. | 522/170 |
| 5,543,266 | 8/1996 | Noguchi et al. | 430/280.1 |

FOREIGN PATENT DOCUMENTS

| | | | |
|---|---|---|---|
| 0 844 262A2 | 5/1988 | European Pat. Off. | 430/280.1 |
| 0 360 869A1 | 4/1990 | European Pat. Off. | 430/280.1 |
| 0 837 366 A1 | 4/1998 | European Pat. Off. | 430/280.1 |
| 0 848 292A1 | 6/1998 | European Pat. Off. | 430/280.1 |
| 64-16802 | 1/1989 | Japan . | |
| 2-75618 | 3/1990 | Japan . | |
| 2-80422 | 3/1990 | Japan . | |
| 4-45125 | 2/1992 | Japan . | |
| 4-261421 | 9/1992 | Japan . | |
| 4-314721 | 11/1992 | Japan . | |
| 8-164440 | 6/1996 | Japan . | |

OTHER PUBLICATIONS

International Search Report—PCT/JP96/01244 (citing seven Japanese language documents listed above).
08164440 A Jun. 25, 1996 Patent Abstracts of Japan.
02075618 A Mar. 15, 1990 Patent Abstracts of Japan.
02080422 A Mar. 20, 1990 Patent Abstracts of Japan.
04261421 A Sep. 17, 1992 Patent Abstracts of Japan.
04314721 A Nov. 5, 1992 Patent Abstracts of Japan.
01016802 A Jan. 20, 1989 Patent Abstracts of Japan.
04045125 A Feb. 14, 1992 Patent Abstracts of Japan.
Mark et al, eds, Encyclopedia of Polymer Science and Engineering, vol. 1, John Wiley & Sons, N.Y., N.Y., 1985, pp. 426–429, 434–439, 452–470.

*Primary Examiner*—Cynthia Hamilton
*Attorney, Agent, or Firm*—Sughrue, Mion, Zinn, Macpeak & Seas, PLLC

[57] ABSTRACT

The stereolithographic resin composition comprising,(1)a catinically polymerizing organic compound, (2)an energy beam sensitive cationic polymerization initiator, and (3)a thermoplastic polymer compound which uniformly dissolves in said resin composition was provided. Therefore, the process for optical solid molding, which enabled the production of highly precise solid shape, was provided using said resin composition.

15 Claims, No Drawings

STEREOLITHOGRAPHIC RESIN COMPOSITION AND STEREOLITHOGRAPHIC METHOD

BACKGROUND OF THE INVENTION

1. Field of the Invention

The present invention relates to a stereolithographic resin composition, and a stereolithographic method using said resin composition. More specifically, the present invention relates to a stereolithographic resin composition which enables the production of high-precision moldings having superior mechanical strength, and a stereolithographic method using said resin composition.

2. Related Art

A stereolithographic method is a technique, as described in Japanese Patent Application Laid-open No.SHO 60-247515, wherein a given portion of photo-curing resin placed in a vessel is exposed continuously to a beam such as argon, helium-cadmium or semiconductor laser from above to cure the exposed portion, in order to produce a desired plane of cured layer. Then the cured layer is overlaid with another layer of the photo-curing resin, which is then photo-cured in the same manner to produce a second cured layer which continuously overlaps the first layer; and the same process is repeated to finally obtain a desired three-dimensional solid shape.

A type of resins previously used for the above-described stereolithographic method are radically polymerizing resin compositions, including photosensitive resins composed primarily of polyester acrylate, urethane acrylate, epoxy acrylate, or polyether acrylate. For example, Japanese Patent Application Laid-open No.HEI2-145616, with the aim of reducing deformation, discloses a stereolithographic resin which contains liquid resin and fine particles whose difference in apparent specific gravity is less than 0.2. Japanese Patent Application Laid-open No.HEI2-208305 discloses a resin composition containing a reactive oligomer and a high content of a specific bifunctional acrylate. For producing moldings at higher precision, Japanese Patent Applications Laid-open No.HEI3-15520 reports a composition comprising an unsaturated ethylene-derivative monomer, a photo-initiator, and a potentially insoluble, potentially radioactive polarizing substance, and Japanese Patent Applications Laid-open No.HEI3-41126 reports a composition comprising an unsaturated ethylene-derivative monomer, a photo-initiator, and a potentially soluble radio-polarizing substance, respectively. In addition, Japanese Patent Application Laid-open No.HEI4-85314 a resin composition comprising a silicone urethane acrylate, a compound having multifunctional ethylene-type unsaturated bonds, and a polymerization initiator.

Another type of stereolithographic resins are known cationically polymerizing resins. For example, Japanese Patent Application Laid-open No.HEI1-213304 discloses an invention characterized by comprising a cationically polymerizing energy beam curable organic compound and a energy sensitive cationic polymerization initiator. Japanese Patent Application Laid-open No.HEI2-28261 discloses a resin comprising a cationically polymerizing energy beam curable organic compound and a portion of a radically polymerizing radio-curing organic compound, which exhibits reduced shrinkage and improved resolution. Also, Japanese Patent Application Laid-open No.HEI2-80423 discloses a resin composition comprising an epoxy resin, a vinyl ether resin, a energy beam sensitive cationic polymerization initiator, a radically curing resin, and a energy beam sensitive radical polymerization initiator. In addition, Japanese Patent Application Laid-open No.HEI2-75618 discloses a stereolithographic resin composition characterized by comprising a cationically polymerizing energy beam curable organic compound, a energy beam sensitive cationic polymerization initiator, a radically polymerizing energy beam curable organic compound, a energy beam sensitive radical polymerization initiator, and a polyester having hydroxyl groups.

However, existing stereolithographic resins do not provide sufficient mechanical strength against impacts on the moldings. The fragileness of the moldings made their application as mechanical parts difficult, as they easily cracked when struck. Another hindrance in using photo-curing resins as a stereolithographic resins is the significant volumetric shrinkage during curing, which results in the warp and distortion of the moldings.

The object of the present invention, therefore, is to provide a stereolithographic resin composition having improved strength against the moldings, and a stereolithographic method using said resin composition.

Another object of the present invention is to provide a stereolithographic resin composition having reduced volumetric shrinkage to prevent warp and distortion during curing, and a stereolithographic method using said resin composition.

SUMMARY OF THE INVENTION

The inventors have, after thorough study, found a stereolithographic resin composition which attains the objects of the present invention with superior impact strength of the moldings, and a stereolithographic method using said resin composition, to finally complete the present invention.

That is, the present invention is a stereolithographic resin composition comprising, as essential components thereof:
(1) a cationically polymerizing organic compound: 100 parts by weight;
(2) an energybeam sensitive cationic polymerization initiator: 0.05 to 10 parts by weight; and
(3) a thermoplastic polymer compound which uniformly dissolves in said resin composition: 3 to 100 parts by weight.

Also, the present invention is a stereolithographic resin composition comprising, as essential components thereof:
(1) a cationically polymerizing organic compound: 100 parts by weight;
(2) an energy beam sensitive cationic polymerization initiator: 0.05 to 10 parts by weight;
(3) a thermoplastic polymer compound: 3 to 100 wt % of the sum of (1) and (4);
(4) a radically polymerizing organic compound: 1 to 100 parts by weight; and
(5) an energy beam sensitive radical polymerization initiator: 0.05 to 10 wt % of (4).

In said resin composition, it is preferable that 50 wt % or more of (1) cationically polymerizing organic compound, 100 parts by weight, is an epoxy compound having two or more epoxy groups per one molecule.

In said resin composition, it is also preferable that 50 wt % or more of (4) radically polymerizing organic compound, 1 to 100 parts by weight, is a radically polymerizing compound having two or more of (meth)acrylic groups per one molecule.

In said resin composition, it is additionally preferable that the number-average molecular weight of (3) thermoplastic polymer compound is 1000 to 500000.

Further, in a stereolithographic method, wherein a given portion of an energy beam curing resin composition is exposed to an energy beam to cure the exposed portion thereof, in order to produce a desired thickness of cured layer; then, the cured layer is overlaid with another layer of the energy beam curable resin composition, which is then cured in the same manner to produce a second cured layer which continuously overlaps the first layer; and the same process is repeated to finally obtain a three-dimensional molding; which comprises using as the energy beam curable resin composition, either of the resin compositions according to the present invention described above.

DESCRIPTION OF THE PREFERRED EMBODIMENTS

In the present invention, (1) cationically polymerizing organic compound, which is an essential component of the stereolithographic resin composition according to the present invention, is a compound which polymerizes or cross-links in the presence of an energy beam sensitive cationic polymerization initiator which is activated by exposure to an energy beam.

Examples of such compounds include epoxy compounds, cyclic ether compounds, cyclic lactone compounds, cyclic acetal compounds, cyclic thioether compounds, spiroorthoester compounds, and vinyl compounds. They may be used independently or in combination. Among them, epoxy compounds are suited for their availability and case of handling. As such epoxy compounds, aromatic, alicyclic and aliphatic epoxy resins and the like are best suited.

Examples of the aromatic epoxy resins include polyglycidyl ethers of polyhydric phenols or their adducts with alkylene oxide, such as bisphenol A, bisphenol F, the glycidyl ethers of their adducts with alkylene oxides, or epooxy-novolac resins.

Further, examples of the alicyclic epoxy resins include polyglycidyl ethers of poly-hydric alcohols having at least one alicyclic ring, or a compound having a structure of cyclohexene-oxide or cyclopentene-oxide obtained by epoxidation of a compound having a structure of cyclohexene- or cyclopentene-ring with an oxidant. For example, mention may be made of diglycidyl ether of hydrogenated bisphenol A, 3,4-epoxycylohexylmethyl-3,4-epoxycyclohexyl carboxylate, 3,4-epoxy-1-methylcylohexyl-3,4-epoxy-1-methylcyclohexane carboxylate, 6-methyl-3,4-epoxycylohexylmethyl-6-methyl-3,4-epoxycyclohexane carboxylate, 3,4-epoxy-3-methylcylohexylmethyl-3,4-epoxy-3-methylcyclohexane carboxylate, 3,4-epoxy-5-methylcylohexylmethyl-3,4-epoxy-5-methylcyclohexane carboxylate, 2-(3,4-epoxycyclohexyl-5,5-spiro-3,4-epoxy)cyclohexane-methadioxane, bis(3,4-epoxycyclohexylmethyl) adipate, vinyl cyclohexene dioxide, 4-vynyl epoxycyclohexane, bis (3,4-epoxy-6-methylcyclohexylmethyl) adipate, 3,4-epoxy-6-methylcyclohexyl carboxylate, methylene bis(3,4-epoxycyclohexane), dicyclopentadiene diepoxide, ethyleneglycol di (3,4-epoxycyclohexylmethyl) ether, ethylene bis(3,4-epoxycyclohexane carboxylate), dioctyl epoxyhexahydrophthalate, di-2-ethylhexyl epoxyhexahydrophthalate, and the like.

Examples of the aliphatic epoxy resins include polyglycidyl ethers of aliphatic polyhydric alcohols or their alkylene oxide adducts, polyglycidyl esters of aliphatic, long chain, poly-basic acids, homopolymers of glycidyl acrylate or methacrylate, copolymers of glycidyl acrylate or methacrylate, and the like. Typical examples of such compounds include glycidyl ethers of polyhydric alcohols, such as 1,4-butanediol diglycidyl ether, 1,6-hexanediol diglycidyl ether, triglycidyl ether of glycerol,triglycidyl ether of trimethylol propane, tetraglycidyl ether of sorbitol, hexaglycidyl ether of dipentaerythritol, diglycidyl ether of polyethylene glycol, and diglycidyl ether of polypropylene glycol; polyglycidyl ethers of polyether-polyols, which can be obtained by adding one or more alkylene oxides with aliphatic polyhydric alcohols such as propylene glycol, glycerol; and diglycidyl esters of aliphatic, long chain di-basic acids. Further, mention may be made of mono-glycidyl ethers of aliphatic higher alcohols; mono-glycidyl ethers of phenol, cresol, butyl phenol, or polyether alcohols which can be obtained by adding alkylene oxide thereto; glycidyl esters of higher fatty acids; epoxidized soybean oil; octyl epoxystearate; butyl epoxy-stearate; epoxidized linseed oil; epoxidized polybutadiene and the like.

Furthermore, it is particularly preferable to employ an epoxy compound having two or more epoxy groups per one molecule among the epoxy compounds described above in an amount of 50 wt % or more based on 100 parts by weight of (1) cationically polymerizing organic compounds capable of curing upon exposure to an energy beam. As 50 wt % or less of the remaining component, use may be made of a compound having one epoxy group per one molecule or a cationically polymerizing organic compound except for epoxy compounds, as listed below. And also, it is preferable to employ the mixture of the cationically polymerizing organic compound except for epoxy compounds and the cyclohexene oxide compound described above.

Examples of (1) cationically polymerizing organic compounds except for epoxy compounds, which can be employ in this invention, include trimethylene oxide, oxetane compounds such as 3,3-dimethyl oxetane and 3,3-dichloromethyl oxetane; oxofuran compounds such as tetrahydrofuran and 2,3-dimethyl-tetrahydrofuran; cyclic acetal compounds such as trioxane, 1,3-dioxorane and 1,3, 6-trioxane cyclooctane; cyclic lactones such as β-propiolactone and ϵ-caprolactone; thiirane compounds such as ethylene sulfide and thio-epichlorohydrine; thietane compounds such as 1,3-propyne sulfide and 3,3-dimethyl thietane; cyclic thio-ether compounds such as tetrahydrothiophene derivatives; vinyl compounds such as ethylene glycol divinylether, alkyl vinylether, 3,4-dihydropyrane-2-methyl (3,4-dihydropyrane-2-carboxylate) and triethyleneglycol divinyl ether; spiro-ortho ester compounds obtained by the reaction of an epoxy compound and a lactone; ethylenic unsaturated compounds such as vinyl cyclohexene, isobutylene and polybutadiene, and derivatives thereof.

According to the present invention, the cationically polymerizing material described above may be used as (1) cationically polymerizing organic compound independently or in combination.

Since the stereolithographic resin composition according to the present invention contains mainly the cationically polymerizing organic compound described above, the curing reaction upon exposure to an energy beam is carried out without the effect of oxygen in air, and the sensitivity to an active energy beam is very high. In addition, as the volumetric shrinkage during curing is small to prevent wrap and distortion, which results in high-precision moldings, the composition of the present invention is a superior stereolithographic resin composition. Furthur, as this resin composition has low viscosity before curing, the saving of molding time is possible.

In the present invention, (2) energy beam sensitive cationic polymerization initiator, which is an essential component of the stereolithographic resin composition according to the present invention, is a compound which can emit a substance that initiates cationic polymerization upon exposure to an energy beam, preferably a double salt of an onium which emits a Lewis acid upon exposure, or a derivative thereof. A typical example of such compounds is a salt of a cation and an anion, expressed generically by a formula:

$$[A]^{m+}[B]^{m-}.$$

Preferably, the cation $A^{m+}$ is an onium having a structure such as one expressed as:

$$[(R^1)_a Z]^{m+}.$$

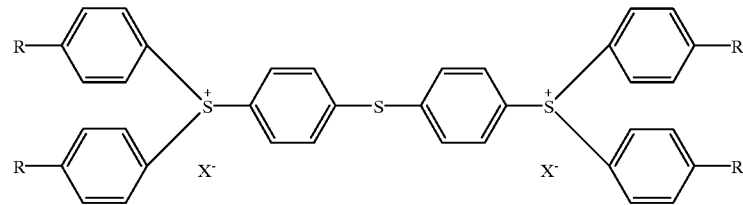

Here, $R^1$ is an organic group having 1 to 60 carbons and any number of non-carbon atoms. The number 'a' is an integral number in the range of 1 to 5. The 'a' groups, $R^1$, are independent of and may be identical or non-identical to each other; preferably, at least one of them is to be an organic group having an aromatic ring as described above. The symbol 'Z' denotes an atom or an atomic group selected from the group consisting of S, N, Se, Te, P, As, Sb, Bi, O, I, Br, Cl, F and N≡N. Assuming the valence of 'Z' in the cation $A^{m+}$ as 'z', it is required that the relation m=a−z is observed.

The anion $B^{m-}$ is preferably a halide complex having a structure such as one expressed as:

$$[LX_b]^{m-}.$$

Here, 'L' is a central metal or metalloid atom of the halide complex, such as B, P, As, Sb, Fe, Sn, Bi, Al, Ca, In, Ti, Zn, Sc, V, Cr, Mn or Co. The symbol 'X' denotes a halogen. The number 'b' is an integral number in the range of 3 to 7. Assuming the valence of 'L' in the anion $B^{m-}$ as 'p', it is required that the relation m=b−p is observed.

Examples of anions expressed by the above generic formula $[LX_b]^{m-}$ include tetrafluoroborate $(BF_4)^-$, hexafluorophosphate $(PF_6)^-$, hexafluoroantimonate $(SbF_6)^-$, hexafluoroarsenate $(AsF_6)^-$, and hexachloroantimonate $(SbCl_6)^-$.

A structure expressed as $[LX_{b-1}(OH)]^{m-}$ may also preferably be used as the anion $B^{m-}$, where 'L', 'X' and 'b' are defined as described above. Other suitable anions include perchloric ion $(ClO_4)^-$, trifluoromethylsulfurous ion $(CF_3SO_3)-$, fluorosulfonic ion $(FSO_3)^-$, toluenesulfonic anion, and trinitrobenzenesulfonic anion.

Among these onium salts, aromatic onium salts can most effectively be used for the present invention, particularly aromatic halonium salts as described in Japanese Patent Application Laid-open Nos.SHO50-151997 and SHO50-158680; aromatic onium salts of the VIA group as described in Japanese Patent Application Laid-open Nos.SHO50-151997, SHO52-30899, SHO56-55420, SHO55-125105, etc.; aromatic onium salts of the VA group as described in Japanese Patent Application Laid-open No.SHO50-158698; oxosulfoxonium salts as described in Japanese Patent Application Laid-open No.SHO56-8428, SHO56-149402, SHO57-192429, etc.; aromatic diazonium salts as described in Japanese Patent Application Laid-open No.49-17040; and thiopyrylium salts as described in U.S. Pat. No. 4,139,655. Other preferable examples of initiators include iron/allene complexes, and aluminum complex/photolytic silicon compounds.

Among these aromatic onium salts, those consisting of compounds expressed generically as have an advantage in the photo-curing rate, where 'R', which may be identical or non-identical to each other, is hydrogen, halogen, alkyl group containing 1 to 5 carbons, or alkoxy group containing 1 to 5 carbons which may be substituted with hydroxyl, halogen, or alkoxy group containing 1 to 5 carbons, and '$X^-$' is anion selected from the group consisting of $SbF_6^-$, $PF_6^-$, $SbF_5(OH)^-$ and $PF_5(OH)^-$.

Also, compounds wherein '$X^-$' in the above formula is either $SbF_6^-$ or $SbF_5(OH)^-$ exhibit superior reactivity upon exposure, giving a further advantage in the photo-curing rate.

In the present invention, the content of (2) energy beam sensitive cationic polymerization initiator is 0.05 to 10 parts by weight, preferably 0.5 to 10 parts by weight, per 100 parts by weight of (1) cationically polymerizing organic compound. A content below 0.1 parts by weight would fail to cure the resin composition completely, and that above 10 parts by weight would not give sufficient strength to the cured resin.

In the present invention, (3) thermoplastic polymer compound is a polymer compound which is in a liquid or solid state at room temperature and mixes uniformly with the resin composition at room temperature.

Typical examples of such thermoplastic polymer compounds which dissolve uniformly with the resin composition include polyester, polyvinyl acetate, polyvinyl chloride, polybutadiene, polycarbonate, polystyrene, polyvinyl ether, polyvinylbutyral, polyacrylate, polymethyl methacrylate, polybutene, and styrene-butadiene block copolymer hydrogenated. Derivatives of these thermoplastic polymer compounds having functional groups such as a hydroxyl, carboxyl, vinyl or epoxy group may also be used. The preferable number-average molecular weight of said thermoplastic polymer compound as used in the present invention is 1000 to 500000, most preferably 5000 to 100000. A molecular weight outside this range may be practicable; however, an excessively low molecular weight would fail to attain desired improvement in strength, and excessively high one would increase the viscosity of the resin composition, making it unsuited for optical solid molding.

The content of (3) thermoplastic polymer compound in the stereolithographic resin composition according to the present invention is 3 to 100 wt % of the resin content of the composition, i.e., (1) cationically polymerizing organic compound, or the sum of (1) and (4) radically polymerizing organic compound, preferably 10 to 30 wt %. A content of 3 wt % or less would fail to attain the aforementioned characteristics, and that above 100 wt % would impair the curing property. A molding of the resin composition according to the present invention has improved impact strength as it contains (3) thermoplastic polymer compound. Generally, resin is required to have two opposing characteristics: bending strength and impact strength. The present invention attains higher impact strength without impairing the bending strength, while improving the precision of the molding relative to the design dimensions.

In the present invention, (4) radically polymerizing organic compound, which is a component of the stereolithographic resin composition according to the present invention, is a radically polymerizing compound which polymerizes or cross-links upon exposure to an energy beam in the presence of a energy beam sensitive radical polymerization initiator and, preferably, has at least one unsaturated double bond per one molecule.

Examples of such compounds include acrylate compounds, methacrylate compounds, allyl urethane compounds, unsaturated polyester compounds, and polythiol compounds.

Among these radically polymerizing organic compounds, those having two or more (meth) acrylic groups per one molecule, such as epoxy (meth)acrylates, urethane (meth) acrylates, polyester (meth)acrylates, polyether (meth) acrylates, (meth)acrylic esters of alcohols, are best suited, for their availability and ease of synthesis and handling.

Here, epoxy (meth) acrylates refer to acrylates which are obtained by the reaction of, for example, a known aromatic, alicyclic or aliphatic epoxy resin and (meth) acrylic acid. The most preferable of these epoxy (meth)acrylates are the (meth) acrylates of aromatic epoxy resins which are obtained by the reaction of a polyglycidyl ether of a polyhydric phenol having at least one aromatic nuclei or an added alkylene oxide thereof, and (meth)acrylic acid. One example is the (meth) acrylate obtained by the reaction of a glycidyl ether and (meth)acrylic acid, the former obtained by the reaction of bisphenol A or an added alkylene oxide thereof and epichlorohydrin. Another example is the (meth) acrylate obtained by the reaction of an epoxy novolac resin and (meth)acrylic acid.

The most preferable urethane (meth)acrylates are those obtained by the reaction of one or more polyesters or polyethers having a hydroxyl group, a (meth) acrylic ester having a hydroxyl group, and an isocyanate, and those obtained by the reaction of a (meth)acrylic ester having a hydroxyl group and an isocyanate.

Among polyesters having a hydroxyl group, the most preferable ones are those obtained by the reaction of one or more polyhydric aliphatic alcohols and one or more polybasic acids. Examples of the polyhydric aliphatic alcohols include 1,3-butanediol, 1,4-butanediol, 1,6-hexanediol, diethylene glycol, triethylene glycol, neopentyl glycol, polyethylene glycol, polypropylene glycol, trimethylolpropane, glycerol, pentaerythritol, and dipentaerythritol.

Examples of the polybasic acids include adipic acid, terephthalic acid, phthalic anhydride, and trimellitic acid.

Among polyethers having a hydroxyl group, the most preferable ones are those obtained by adding one or more alkylene oxides to a polyhydric aliphatic alcohol. Examples of the polyhydric aliphatic alcohols are such as those listed above. Examples of the alkylene oxides include ethylene oxide and propylene oxide.

Among (meth)acrylic esters having a hydroxyl group, the most preferable ones are those obtained by the esterification of a polyhydric aliphatic alcohol and (meth)acrylic acid. Examples of the polyhydric aliphatic alcohols are such as those listed above.

The best suited of these (meth)acrylic esters having a hydroxyl group are those obtained by the esterification of a dihydric aliphatic alcohol and (meth)acrylic acid, such as 2-hydroxyethyl (meth)acrylate.

Among isocyanates, the most preferable ones are those having at least one or more isocyanic group per one molecule, particularly divalent isocyanic compounds such as tolylene diisocyanate, hexamethylene diisocyanate, and isophorone diisocyanate.

The most preferable polyester (meth)acrylates are those obtained by the reaction of a polyester having a hydroxyl group and (meth)acrylic acid. Among polyesters having a hydroxyl group, the most preferable ones are those obtained by the esterification of one or more polyhydric aliphatic alcohols and one or more monoacids, polybasic acids, or phenols. Examples of the polyhydric aliphatic alcohols are such as those listed above. Examples of the monoacids include formic acid, acetic acid, butylcarboxylic acids, and benzoic acid. Examples of the polybasic acids include adipic acid, terephthalic acid, phthalic anhydride, and trimellitic acid. Examples of the phenols include phenol, p-nonyl phenol, and bisphenol A.

The most preferable polyether (meth)acrylates are those obtained by the reaction of a polyether having a hydroxyl group and (meth)acrylic acid. Among polyethers having a hydroxyl group, the most preferable ones are those obtained by adding one or more alkylene oxides to a polyhydric aliphatic alcohol. Examples of the polyhydric aliphatic alcohols are such as those listed above. Examples of the alkylene oxides include ethylene oxide and propylene oxide.

The most preferable (meth) acrylic esters of alcohols are (meth)acrylates obtained by the reaction of an aromatic or aliphatic alcohol having at least one hydroxyl group per one molecule or an added alkylene oxide thereof, and (meth) acrylic acid. Examples of such (meth)acrylates include 2-ethylhexyl (meth)acrylate, 2-hydroxyethyl (meth)acrylate, 2-hydroxypropyl (meth)acrylate, isoamyl (meth)acrylate, lauryl (meth)acrylate, stearyl (meth)acrylate, isooctyl (meth) acrylate, tetrahydrofurfuryl (meth)acrylate, isobonyl (meth) acrylate, benzyl (meth)acrylate, 1,3-butanediol di(meth) acrylate, 1,4-butanediol di(meth)acrylate, 1,6-hexanediol di(meth)acrylate, diethylene glycol di(meth)acrylate, triethylene glycol di(meth)acrylate, neopentyl glycol di(meth) acrylate, polyethylene glycol di(meth)acrylates, polypropylene glycol di(meth)acrylates, trimethylolpropane tri(meth) acrylate, pentaerythritol tri(meth)acrylate, dipentaerythritol hexa(meth)acrylate, and ε-caprolactone-modified dipentaerythritol hexa(meth)acrylate.

The best suited of these (meth)acrylates are poly(meth) acrylates of polyhydric alcohols.

The above radically polymerizing organic compounds may be used independently or in combination to attain a desired property.

The content of said (4) radically polymerizing organic compound is 1 to 100 parts by weight, preferably 10 to 50 parts by weight, per 100 parts by weight of (1) cationically polymerizing organic compound. If the content exceeds this range, curing is hampered by oxygen to reduce curing rate during curing and, thus, after-curing may be required, while shrinkage during curing may cause warp.

It is also preferable that 50 wt % or more of the radically polymerizing organic compound, 1 to 100 parts by weight, is a radically polymerizing organic compound having two or more (meth)acrylic groups per one molecule.

The resin composition according to the present invention with a radically polymerizing resin improves the curing rate in a stereolithographic method, compared with the composition without it, which is preferably used as a stereolithographic resin composition.

The (5) energy beam sensitive radical polymerization initiator which is one component in the stereolithographic resin composition according to the present invention, preferably, includes ketone series compounds such as acetophenone series compounds, benzoin ether series compounds, benzyl series compounds and thioxanthone series compounds. Acetophenone series compounds include, for example, diethoxyacetophenone, 2-hydroxymethyl-1-phenylpropane-1-one, 4'-iso-propyl-2-hydroxy-2-methylpropiophenone, 2-hydroxy-2-methylpropiophenone, 2,2-dimethoxy-1,2-diphenylethane-1-one, p-dimethylaminoacetophenone, p-tert-buthyldichloroacetophenone, p-tert-buthyltrichloroacetophenone, p-azidobenzalacetophenon, 1-hydroxycyclohexylphenylketone, 2-methyl-1-[4-(methylthio)phenyl]-2-morpholinopropanone-1,2-benzyl-2-dimethylamino-1-(4-morpholinophenyl)-butanone-1 and the like.

Benzoin ether series compounds inclede, for example, benzoin, benzoin methyl ether, benzoin ethyl ether, benzoin isopropyl ether, benzoin-n-butyl ether, benzoin isobutyl ether and the like.

Benzyl series compounds include benzyl, anisyl, benzyl methyl ketal, benzyl-β-methoxyethylacetal and the like.

Benzophenone series compounnds include, for example, benzophenone, methyl o-benzoyl benzoate, Michler's ketone, 4,4'-bisdiethylaminobenzophenone, 4,4'-dichlorobenzophenone, 4-benzoyl-4'-methyldiphenyl sulfide and the like. Thioxanthone series compounds include thioxanthone, 2-methylthioxanthone, 2-ethylthioxanthone, 2-chlorothioxanthone, 2-isopropylthioxanthone, 2,4-diethylthioxanthone and the like.

Other energy beam sensitive radical polymerization initiators include 2,4,6-trimethylbenzoyldiphenyl phosphein oxide, bis(cyclopentadienyl)-bis[2,6-difluoro-3-(pyl-1-yl)] titanium and the like.

The above energy beam sensitive radical polymerization initiators may be used independently or in combination to attain a desired property. The content of (5) energy beam sensitive radical polymerization initiator described above is 0.05 to 10 wt %, preferably 0.1 to 10 wt % based on the weight of (4) radically polymerizing organic compounds capable of curing upon exposure to an energy beam. If the content exceeds this range, the resulting resin has an insufficient strength, and if below, the cure of the resin is insufficient.

(6) Organic compounds having two or more hydroxyl groups per one molecule, which is one component in the stereolithographic resin composition according to the present invention, preferably include polyhydric alcohols, polyethers containing hydroxy groups, polyesters containing hydroxy groups and polyhydric phenols.

Examples of the polyhydric alcohols include ethylene glycol, propylene glycol, neopentyl glycol, trimethylolpropane, glycerine, pentaerythritol, dipentaerythritol, 1,3-butanediol, 1,4-butanediol, 1,6-hexanediol and the like.

The polyether containing hydroxy groups means a compound obtained by adding one or more alkylene oxide to one or more polyhydric alcohols or one or more polyhydric phenols. Examples of the polyhydric alcohols or polyhydric phenols used therein include ethylene glycol, propylene glycol, neopentyl glycol, trimethylolpropane, glycerine, pentaerythritol, dipentaerythritol, 1,3-butanediol, 1,4-butanediol, 1,6-hexanediol, bisphenol A, bisphenol F, phenol novolak, cresol novolak and the like. Examples of the alkylene oxides include propylene oxide, ethylene oxide and the like.

The polyester containing hydroxy groups means a polyester obtained by esterificatioin of one or more monobasic or polybasic acids and one or more polyhydric alcohols and/or polyhydric phenols, and a polyester obtained by esterification of one or more lactones and one or more polyhydric alcohols. Examples of the polyhydric alcohols or polyhydric phenols such as those listed above. Examples of the monobasic acids include formic acid, acetic acid, butyl carboxylic acid, benzoic acid and the like. Examples of the polybasic acids include adipic acid, terephthalic acid, trimellitic acid and the like. Examples of the phenols include phenol and p-nonyl phenol. Examples of the lactones include β-propiolactone and ε-caprolactone. Examples of the polyhydric phenols include bisphenol A, bisphenol F, and the like.

The polyhydric phenol means a compound containing two or more hydroxy groups, bonded directly to aromatic ring, per one molecule. For example, mention may be made of bisphenol A, bisphenol F, phenol novolak resin, cresol novolak resin and the like.

These (6) organic compounds containing two or more hydroxyl groups per one molecule may be used independently or in combination to attain a desired property. The content of the organic compounds containing two or more hydroxyl groups per one molecule is preferably 1 to 50 parts by weight, based on 100 parts by weight of (1) cationically polymerizing organic compounds in the resin composition. The addition of (6) organic compound containing two or more hydroxyl groups per one molecule improves the impact strength of the molding with keeping its bending strength. And also, the reactivity of the resin is improved to increase the curing rate.

Among the organic compounds containing two or more hydroxyl groups per one molecule, those which have the molecular weight of less than 1000 and the hydroxyl value of less than 300 can particularly preferably exhibit such a superior effect as described above, which can be obtained when (6) organic compound containing two or more hydroxy groups per one molecule is added.

In the stereolithographic resin composition according to the present invention, if desired, a photosensitizer can be added, which is not essential. For example, the use of photosensitizer such as anthracene derivative or pyrene derivative improves the curing rate of the molding in a stereolithographic method and exhbits preferable property as a resin composition, compared without it.

Further, various resin additives, such as thermosensitive cationic polymerization initiater, inorganic filler, organic filler, coloring agent such as pigment and dye, leveling agent, defoamer, thickener, filler material, frame retardant, antioxidant and stabilizer, may be added as desired, provided that they do not impair the advantage of the present invention. As the thermosensitive cationic polymerization initiater, for example, aliphatic onium salts described in Japanese Patent Application Laid-open Nos.SHO57-49613 and SHO58-37004, can be mentioned.

In the present invention, aforementioned various resin additives, such as photosensitizer, thermosensitive cationic polymerization initiator, coloring agent such as pigment or dye, leveling agent, defoamer, thickener, flame retardant, filler, antioxidant, and stabilizer, may be added as desired in the amounts of their normal use, provided that they do not impair the advantage of the present invention. However, it is preferable that they are limited to 150 wt % or below of the total amount of the stereolithographic resin composition according to the present invention, so as not to amplify the distortion of the obtained molding.

The active energy beam required to cure the resin composition according to the present invention may be an ultraviolet ray, an electron beam, an X-ray, a radioactive ray, or a high-frequency wave, preferably an ultraviolet ray for the economical reason. Examples of a source of the ultraviolet ray include an ultraviolet laser, a mercury lamp, a xenon lamp, a sodium lamp, and an alkali metal lamp. The most preferable source is a laser for its superior light convergence property, particularly one with an emission wavelength of 300 to 450 nm.

Next, the stereolithographic method according to the present invention is described below:

The first step to carry out the stereolithographic method according to the present invention is to prepare a stereolithographic resin composition from: (1) a cationically polymerizing organic compound; (2) an energy beam sensitive cationic polymerization initiator; and (3) a thermoplastic polymer compound; in combination with, as necessary, (4) a radically polymerizing organic compound; (5) an energy beam sensitive radical polymerization initiator; (6) an organic compound having two or more hydroxyl groups per one molecule; and other constituents.

This step may be performed in a known manner by, for example, thoroughly mixing (1) through (6) above by blade turbine agitation, roll kneading, or other method. The preferred compounding ratio of (1) through (6) and the types and contents of the additives to be mixed as necessary may be selected according to the aforementioned preferred compounding ratio of (1) through (6) and the types and contents of the additives to be mixed as necessary, which are set forth for the stereolithographic resin composition. Thus obtained stereolithographic resin composition is generally in a liquid state at room temperature.

In the next step, a given portion of the resin composition is exposed to an energy beam to cure the exposed portion thereof, in order to produce a desired thickness of cured layer; then, the cured layer is overlaid with another layer of the energy beam curing resin composition, which is radio-cured in the same manner to produce a cured layer which continuously overlaps the first above-described cured; and the same process is repeated to finally obtain a three-dimensional solid shape. For example, the resin composition is placed in a vessel such as one described in Japanese Patent Application Laid-open No.60-247515; a light guide is set on the surface of the resin composition; a selected portion of the surface of the resin composition is exposed to an active energy beam, which is necessary for curing, through the light guide, while moving the light guide relative to the vessel, to obtain a desired solid shape.

The type of the active energy beam required for the stereolithographic method according to the present invention is the same as the active energy beam used for curing the resin composition according to the present invention. That is, an ultraviolet ray, an electron beam, an X-ray, a radioactive ray, or a high-frequency wave may be used, preferably an ultraviolet ray for the economical reason. Examples of a source of an ultraviolet ray include an ultraviolet laser, a mercury lamp, a xenon lamp, a sodium lamp, and an alkali metal lamp. The most preferable source is a laser for its superior light convergence property, particularly one with an emission wavelength of 300 to 450 nm.

The following describes various examples in carrying out the present invention. Note that the term "part" as used in the examples is intended to mean "part by weight."

EXAMPLE 1

A stereolithographic resin composition was obtained by thoroughly mixing the following:

(1) 75 parts of 3,4-epoxycyclohexylmethyl-3,4-epoxycyclohexane carboxylate and 25 parts of 1,4-butanedioldiglycidyl ether, as a cationically polymerizing organic substance.

(2) 3 parts of bis-[4-(diphenylsulfonio)phenyl]sulfide bishexafluoroantimonate, as an energy beam sensitive cationic polymerization initiator.

(3) 20 parts of polyester having a hydroxyl group and a carboxyl group at the molecular terminals with a number-average molecular weight of 50000, which was obtained from ethylene glycol, terephthalic acid, and adipic acid in a molar ratio of 1:0.7:0.3, as a thermoplastic polymer compound. The obtained resin composition was a transparent light-yellow liquid.

Then, a bending test specimen and an impact test specimen were obtained from the above resin composition by curing it in steps of 0.1 mm thickness according to CAD data, using a stereolithographic experiment system which consisted of a three-dimensional numerically controlled table on which a container for the resin composition was to be placed, an argon laser (wavelength: 333, 351 and 364 nm), and a control unit comprising an optical system and a control computer. The specimens were tested for bending strength and Izod impact strength (notched) according to the test method described in JIS K 6911.

The bending strength and the Izod impact strength (notched) of the specimens were 510 kg/cm$^2$ and 32 kg/cm.cm$^2$, respectively. Also, the precision of a shape molded from this resin, 100 mm in length, 100 mm in width, and 10 mm in height, was 0.012% relative to the design dimensions.

Next, the resin composition according to the present invention as shown in Table 1 was tested in the same manner as in example 1. The resin composition and the test results are shown in Tables 1 and 2, respectively. For reference, the resin composition as shown in Table 2 was also tested in the same manner as in example 1. The compounds used for the test were as follows:

For the cationically polymerizing organic compounds (hereafter "cationic resins"), cationic resins 1 through 3 as shown below were used:

Cationic resin 1: 3,4-epoxycyclohexylmethyl-3,4-epoxycyclohexane carboxylate.

Cationic resin 2: 1,4-butanedioldiglycidyl ether.

Cationic resin 3: bis(3,4-epoxycyclohexylmethyl)adipate.

For the energy beam sensitive cationic polymerization initiators (hereafter "cationic initiators"), cationic initiators 1 and 2 as shown below were used:

Cationic initiator 1: bis-[4-(diphenylsulfonio)phenyl]sulfide bishexafluoroantimonate.

Cationic initiator 2: bis-[4-(diphenylsulfonio)phenyl]sulfide bishexafluorophosphate.

For the thermoplastic polymer compounds (hereafter "thermoplastics"), thermoplastics 1 through 7 as shown below were used:

Thermoplastic 1: a polyester having a hydroxyl group and a carboxyl group at the molecular terminals with a number-average molecular weight of 50000, which was obtained from ethylene glycol, terephthalic acid, and adipic acid in a molar ratio of 1:0.7:0.3.

Thermoplastic 2: a polyvinyl acetate with a number-average molecular weight of 20000.

Thermoplastic 3: a polyvinyl acetate with a number-average molecular weight of 200000.

Thermoplastic 4: a styrene-butadiene copolymer hydrogenate with a number-average molecular weight of 500000 and a styrene content of 20%.

Thermoplastic 5: a polyvinyl chloride with a number-average molecular weight of 50000.

Thermoplastic 6: a polyvinyl acetate with a number-average molecular weight of 50000.

Thermoplastic 7: a polyvinyl chloride with a number-average molecular weight of 10000.

For the radically polymerizing organic compounds (hereafter "radical resins"), radical resins 1 through 3 as shown below were used:

Radical resin 1: bisphenol A diglycidyl ether diacrylate.
Radical resin 2: trimethylolpropane triacrylate.
Radical resin 3: dipentaerythritol hexaacrylate.

For energy beam sensitive radical polymerization initiators (hereafter "radical initiators"), radical initiators 1 and 2 as shown below were used:

Radical initiator 1: benzophenone.
Radical initiator 2: 2-hydroxy-2-methyl-1-phenylpropane-1-one For organic compounds having two or more hydroxyl groups per one molecule (hereafter "OH compounds"), OH compounds 1 through 3 as shown below were used:

OH compound 1: trimethylolpropane with the addition of ε-caprolactone having an average molecular weight of 500.

OH compound 2: glycerol with the addition of ethylene oxide having an average molecular weight of 500.

OH compound 3: bisphenol A.

TABLE 1

| Example | | 1 | 2 | 3 | 4 | 5 | 6 | 7 | 8 | 9 |
|---|---|---|---|---|---|---|---|---|---|---|
| (1) | Cationic resin 1 | 75 | 75 | 75 | 40 | 100 | 88 | | 58 | 88 |
| | Cationic resin 2 | 25 | 25 | 25 | 20 | | 12 | 60 | 42 | 12 |
| | Cationic resin 3 | | | | 40 | | | 40 | | |
| (2) | Cationic initiator 1 | 3 | 3 | | 5 | 3 | 3 | 3 | | 3 |
| | Cationic initiator 2 | | | 3 | | | | | 3 | |
| (3) | Thermoplastic 1 | 20 | | | | | | | 15 | 30 |
| | Thermoplastic 2 | | 30 | | | | 50 | | | |
| | Thermoplastic 3 | | | 5 | | | | | | |
| | Thermoplastic 4 | | | | 15 | | | | | |
| | Thermoplastic 5 | | | | | 100 | | | | |
| | Thermoplastic 6 | | | | | | 90 | | | |
| (4) | Radical resin 1 | | | 15 | 40 | 15 | 15 | 30 | 30 | 15 |
| | Radical resin 2 | | | | | | 15 | 30 | | 15 |
| | Radical resin 3 | | | | 40 | 15 | | | 15 | |
| (5) | Radical initiator 1 | | | 2 | | 2 | 2 | 2 | 2 | |
| | Radical initiator 2 | | | | 5 | | | | | 2 |
| (6) | OH compound 1 | | | | | | | | | |
| | OH compound 2 | | | | | | | | | 40 |
| | OH compound 3 | | | | | | | | | |
| | Bending strength | 510 | 530 | 740 | 820 | 670 | 520 | 510 | 690 | 590 |
| | Impact strength | 32 | 20 | 20 | 27 | 27 | 28 | 32 | 28 | 44 |
| | Precision | 0.012 | 0.018 | 0.020 | 0.018 | 0.021 | 0.015 | 0.023 | 0.022 | 0.020 |

TABLE 2

| | | Example | | | Comparative example | | | | |
|---|---|---|---|---|---|---|---|---|---|
| | | 10 | 11 | 12 | 1 | 2 | 3 | 4 | 5 |
| (1) | Cationic resin 1 | 88 | 88 | 75 | 75 | 88 | 85 | 40 | 75 |
| | Cationic resin 2 | 12 | 12 | 25 | 25 | 12 | — | 20 | 25 |
| | Cationic resin 3 | — | — | — | — | — | 15 | 40 | — |
| (2) | Cationic initiator 1 | 3 | 3 | 3 | 3 | 3 | 5 | 4 | 3 |
| | Cationic initiator 2 | — | — | — | — | — | — | — | — |
| (3) | Thermoplastic 1 | 30 | — | — | — | — | 1 | — | — |
| | Thermoplastic 2 | — | 50 | 30 | — | — | — | — | — |
| | Thermoplastic 3 | — | — | — | — | — | — | — | — |
| | Thermoplastic 4 | — | — | — | — | — | — | — | — |
| | Thermoplastic 5 | — | — | — | — | — | — | — | — |
| | Thermoplastic 6 | — | — | — | — | — | — | — | — |
| | Thermoplastic 7 | — | — | — | — | — | — | 200 | — |
| (4) | Radical resin 1 | 15 | 15 | — | — | 30 | 30 | 40 | — |
| | Radical resin 2 | 15 | 15 | — | — | — | — | — | — |
| | Radical resin 3 | — | — | — | — | — | 15 | — | — |
| (5) | Radical initiator 1 | — | 2 | — | — | 2 | 2 | 2 | — |
| | Radical initiator 2 | 2 | — | — | — | — | — | — | — |

TABLE 2-continued

|  | | Example | | | Comparative example | | | |
|---|---|---|---|---|---|---|---|---|
|  | | 10 | 11 | 12 | 1 | 2 | 3 | 4 | 5 |
| (6) | OH compound 1 | — | 10 | 5 | — | — | — | — | |
|  | OH compound 2 | — | — | — | — | — | — | — | 200 |
|  | OH compound 3 | 15 | — | — | — | — | — | — | |
|  | Bending strength | 710 | 520 | 540 | 500 | 430 | 510 | — | — |
|  | Impact strength | 45 | 43 | 39 | 3 | 3 | 4 | — | — |
|  | Precision | 0.018 | 0.015 | 0.017 | 0.12 | 0.11 | 0.14 | — | — |

In comparative example No.4 and 5, the resins did not cure.

Industrial Feasibility

As described above, according to the stereolithographic resin composition of the present invention, stereolithographic molding obtained has the improved impact strength and reduced volumetric shrinkage, to prevent warp and distortion during curing. And therefore, by the applying stereolithographic of the present invention, highly precise solid shape can be obtaied.

We claim:

1. A stereolithographic resin composition comprising, as essential components thereof:
    (1) a cationically polymerizing organic compound: 100 parts by weight;
    (2) an energy beam sensitive cationic polymerization initiator: 0.05 to 10 parts by weight;
    (3) a thermoplastic polymer compound: 3 to 100 wt % of the sum of (1) and (4);
    (4) a radically polymerizing organic compound: 1 to 100 parts by weight;
    (5) an energy beam sensitive radical polymerization initiator: 0.05 to 10 wt % of (4); and
    (6) at least one organic compound containing, two or more hydroxyl groups per one molecule: 1 to 50 wt % based on (1).

2. The stereolithographic resin composition of claim 1, wherein 50 wt % or more of (1) cationically polymerizing organic compound, 100 parts by weight, is an epoxy compound having two or more epoxy groups per one molecule.

3. The stereolithographic resin composition of claim 1, wherein (2) energy beam sensitive cationic polymerization initiator is the compound which has the general formula, as follows

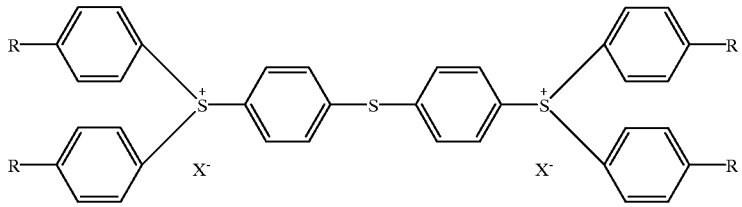

where R, which may be identical or non-identical to each other, is hydrogen, halogen, alkyl group containing 1 to 5 carbons, or alkoxy group containing 1 to 5 carbons which may be substituted with hydroxyl, halogen, or alkoxy group containing 1 to 5 carbons, and $X^-$ is anion selected from the group consisting of $SbF_6^-$, $PF_6^-$, $SbF_5(OH)^-$ and $PF_5(OH)^-$.

4. The stereolithographic resin composition of claim 3, wherein (2) energy beam sensitive cationic polymerization initiator is the compound where anion $X^-$ in the general formula described above is $SbF_6^-$ or $SbF_5(OH)^-$.

5. The stereolithographic resin composition of claim 1, wherein (3) thermoplastic polymer compounds are one or more than two compounds selected from the group consisting of polyester, polyvinyl acetate, polyvinyl chloride, polybutadiene, polycarbonate, polystyrene, polyvinyl ether, polyvinylbutyral, polyacrylate, polymethyl methacrylate, polybutene, hydrogenated styrene-butadiene block copolymer and any of the foregoing thermoplastic polymer compounds having a hydroxyl, carboxyl, vinyl or epoxy group.

6. The stereolithographic resin composition of claim 1, wherein the number-average molecular weight of (3) thermoplastic polymer compound is 1000 to 500000.

7. The stereolithographic resin composition of claim 1 wherein 50 wt % or more of (4) the radically polymerizing organic compound, 1 to 100 parts by weight, is a radically polymerizing compound having two or more (meth)acrylic groups per one molecule.

8. The stereolithographic resin composition of any of claim 1, wherein (6) organic compounds containing two or more hydroxyl groups per one molecule are one or more compounds selected from the group consisting of polyhydric alcohol, polyether containing hydroxyl group, polyester containing hydroxyl group and polyhydric phenol.

9. The stereolithographic resin composition of any of claim 1, wherein (6) organic compound containing two or more hydroxyl groups per one molecule have the molecular weight of less than 1000, and the hydroxyl value of less than 300.

10. A stereolithographic resin composition comprising, as essential components thereof:
    (1) a cationically polymerizing organic compound: 100 parts by weight;
    (2) an energy beam sensitive cationic polymerization initiator: 0.05 to 10 parts by weight, wherein the energy beam sensitive cationic polymerization initiator is the compound which has the following general formula:

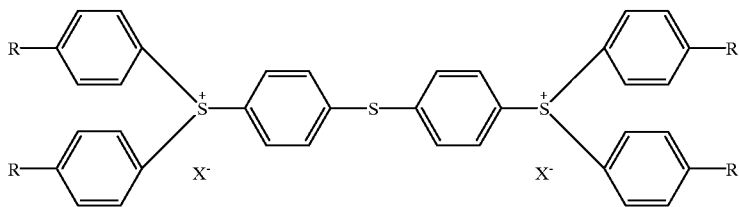

where R, which may be identical or non-identical to each other, is hydrogen, halogen, an alkyl group containing 1 to 5 carbons, or an alkoxy group containing 1 to 5 carbons which may be substituted with hydroxyl, halogen, or alkoxy group containing 1 to 5 carbons, and $X^-$ is an anion selected from the group consisting of $SbF_6^-$, $PF_6^-$, $SbF_5(OH)^-$ and $PF_5(OH)^-$;

(3) a thermoplastic polymer compound: 3 to 100 parts by weight; and (4) at least one organic compound containing two or more hydroxyl groups per one molecule: 1 to 50 wt % based on (1).

11. The stereolithographic resin composition of claim 10, wherein (2) energy beam sensitive cationic polymerization initiator is the compound where anion $X^-$ in the general formula described above is $SbF_6^-$ or $SbF_5(OH)^-$.

12. A stereolithographic resin composition comprising, as essential components thereof:

(1) a cationically polymerizing organic compound: 100 parts by weight;

(2) an energy beam sensitive cationic polymerization initiator: 0.05 to 10 parts by weight;

(3) a thermoplastic polymer compound: 3 to 100 parts by weight, wherein the thermoplastic polymer compound is one or more than two compounds selected from the group consisting of polyester, polyvinyl acetate, polyvinyl chloride, polybutadiene, polycarbonate, polystyrene, polyvinyl ether, polyvinylbutyral, polyacrylate, polymethyl methacrylate, polybutene, hydrogenated styrene-butadiene block copolymer and any of the foregoing thermoplastic polymer compounds having a hydroxyl, carboxyl, vinyl or epoxy group, and;

(2) at least one organic containing compound containing two or more hydroxyl groups per one molecule: 1 to 50 wt % based on (1).

13. A stereolithographic resin composition comprising, as essential components thereof:

(1) a cationically polymerizing organic compound: 100 parts by weight;

(2) an energy beam sensitive cationic polymerization initiator: 0.05 to 10 parts by weight;

(3) a thermoplastic polymer compound: 3 to 100 parts by weight; and (4) at least one organic compound containing two or more hydroxyl groups per one molecule and having a hydroxyl value of less than 300:1 to 50 wt % based on (1).

14. A stereolithographic method, comprising:

exposing a given portion of an energy beam curing resin composition to an energy beam to cure the exposed portion thereof, in order to produce a desired thickness of a first cured layer, wherein the energy beam curing resin composition is a stereolithographic resin composition comprising, as essential components thereof:

(1) a cationically polymerizing organic compound: 100 parts by weight;

(2) an energy beam sensitive cationic polymerization initiator: 0.05 to 10 parts by weight;

(3) a thermoplastic polymer compound: 3 to 100 wt % of the sum or (1) and (4);

(4) a radically polymerizing organic compound: I to 100 parts by weight;

(5) an energy beam sensitive radical polymerization initiator: 0.05 to 10 wt % of (4); and (6) at least one organic compound containing two or more hydroxyl groups per one molecule: 1 to 50 wt % based on (1);

then, overlaying the first cured layer with another layer of the energy beam curable resin composition;

then, curing the overlaid layer in the same manner to produce a cured layer which continuously overlaps the first layer; and repeating the same process to finally obtain a three-dimensional molding.

15. A stereolithographic method, comprising:

exposing a given portion of an energy beam curing resin composition to an energy beam to cure the exposed portion thereof, in order to produce a desired thickness of a first cured layer, wherein the energy beam curing resin composition is a stereolithographic resin composition comprising, as essential components thereof:

(1) a cationically polymerizing organic compound: 100 parts by weight;

(2) an energy beam sensitive cationic polymerization initiator: 0.05 to 10 parts by weight;

(3) a thermoplastic polymer compound: 3 to 100 parts by weight; and (4) at least one organic compound containing two or more hydroxyl groups per one molecule: 1 to 50 wt % based on (1);

then, overlaying the first cured layer with another layer of the energy beam curable resin composition;

then, curing the overlaid layer in the same manner to produce a cured layer which continuously overlaps the first layer; and repeating the same process to finally obtain a three-dimensional molding.

* * * * *